United States Patent [19]

Johnson

[11] 4,241,109
[45] Dec. 23, 1980

[54] TECHNIQUE FOR ALTERING THE PROFILE OF GRATING RELIEF PATTERNS

[75] Inventor: Leo F. Johnson, Bedminster, N.J.

[73] Assignee: Bell Telephone Laboratories, Incorporated, Murray Hill, N.J.

[21] Appl. No.: 34,591

[22] Filed: Apr. 30, 1979

[51] Int. Cl.³ .............................................. B05D 5/06
[52] U.S. Cl. .................... 427/162; 156/600; 156/643; 350/96.30; 427/87; 427/259; 427/271; 430/321; 430/322; 430/323; 430/324
[58] Field of Search .............. 427/162, 259, 271; 156/600, 643; 350/96.30; 430/321, 322, 323, 324

[56] References Cited

U.S. PATENT DOCUMENTS

| | | | |
|---|---|---|---|
| 3,211,570 | 10/1965 | Salisbury | 427/162 |
| 3,865,625 | 2/1975 | Cho et al. | 350/96.34 |
| 3,904,462 | 9/1975 | Dimigen et al. | 156/643 |
| 3,930,065 | 12/1975 | Baker et al. | 427/259 |
| 4,013,465 | 3/1977 | Clapham et al. | 430/321 |
| 4,100,313 | 7/1978 | Hammer et al. | 427/162 |
| 4,171,234 | 10/1979 | Nagata et al. | |

FOREIGN PATENT DOCUMENTS 131315   6/1978   Fed. Rep. of Germany ........... 156/643

OTHER PUBLICATIONS

Tsang et al., "Growth of GaAs-Ga$_{1-x}$Al$_x$As . . . ", Applied Physics Letters, vol. 30, No. 6, Mar. 1977.

*Primary Examiner*—John D. Smith
*Attorney, Agent, or Firm*—Michael J. Urbano

[57] ABSTRACT

An oblique shadow deposition technique for altering the profile of grating relief patterns on surfaces is described. In one aspect the technique essentially represents a method whereby a series of grating masks may be superimposed in precise registration with each other. By appropriate choice of deposition angle, deep grooves may be generated from shallow profiles, rounded or sinusoidal profiles may be transformed to structures with planar vertical walls, and symmetric profiles may be made asymmetric.

10 Claims, 5 Drawing Figures

TECHNIQUE FOR ALTERING THE PROFILE OF GRATING RELIEF PATTERNS

BACKGROUND OF THE INVENTION

This invention relates to the fabrication of gratings on the surface of a body.

In recent years a vast number of devices employing grating relief patterns (i.e., arrays of parallel stripes separated by grooves) on surfaces have been proposed or demonstrated. These devices include distributed feedback heterostructure junction lasers, optical grating couplers and optical frequency filters. For many of these applications, it is important to be able to specify and control not only the grating period, but also the depth and shape of the grating profile. For example, the shape of the stripes in a grating coupler determines the distribution of diffracted light between two possible directions. The depth of the grooves in a distributed feedback structure, on the other hand, determines the reflectivity of the grating. In the prior art, these gratings are generally made by masking the body with photoresist stripes and then ion-milling. This procedure is adequate as long as the milling rate of the body exceeds that of the photoresist by a significant amount. Otherwise, the photoresist will be milled away before any appreciable grating depth is achieved, as with the case of YAG which has a milling rate less than half that of typical photoresists. Aside from the relative milling rates of the mask and body, however, prior art grating fabrication technique is generally not amenable to shaping the grating profile to satisfy specialized functions such as required of the optical grating coupler.

SUMMARY OF THE INVENTION

In accordance with one aspect of this invention, an oblique shadow deposition technique permits a series of grating masks to be superimposed in precise registration with one another so that the depth, shape and symmetry of existing profiles may be altered. The method comprises directing a beam of material at a shallow angle to the surface of the body carrying the existing profile so that the stripes shadow the grooves from the beam and material is deposited predominantly on the stripes, whereas no appreciable amount of material is deposited in the grooves. Consequently, the height of the stripes is increased as is the aspect ratio. By performing similar depositions from two different directions, symmetric profiles can be formed, whereas deposition from one direction only generally yields an asymmetric profile. In either case, ion milling or other suitable techniques are then used to remove material of the body in the grooves, thereby forming or altering a grating in the body.

In conjunction with ion-beam milling, the technique has been used to increase the depth of fine period gratings on GaAs and to produce grooves about 4000 Angstroms deep on the surface of YAG, ten times deeper than could be obtained by ion-beam milling of photoresists alone.

BRIEF DESCRIPTION OF THE DRAWING

This invention, together with its various features and advantages, can be readily understood from the following more detailed description taken in conjunction with the accompanying drawing in which:

FIG. 3 shows the profile of the grating in a photoresist mask; FIG. 4 shows the mask after alternate Ta depositions; and FIG. 5 shows the grating profile in YAG after ion-beam milling using the mask of FIG. 4.

DETAILED DESCRIPTION

Figure 1:
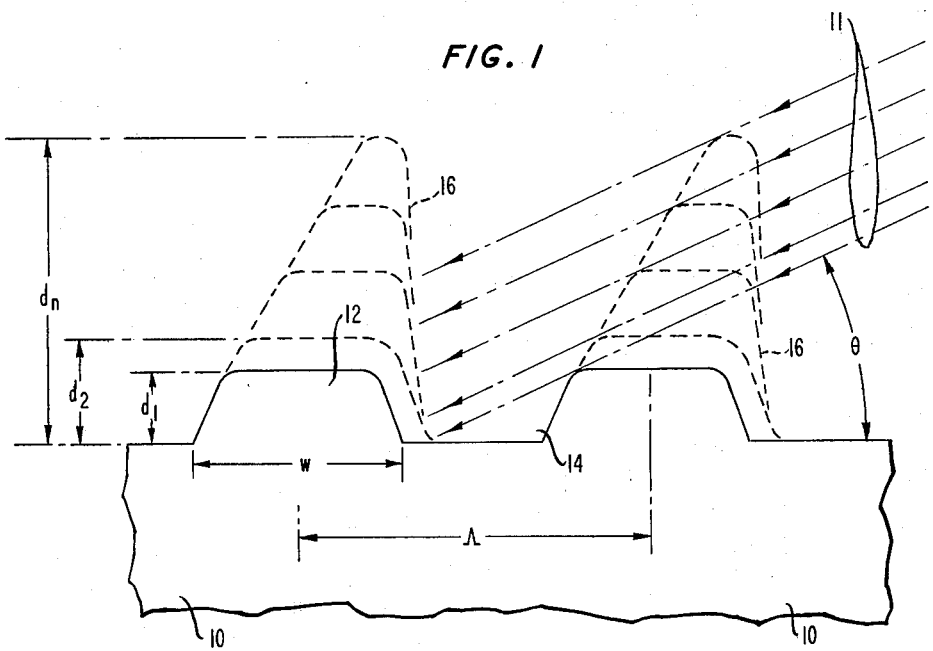
FIG. 1 is a schematic diagram showing the change in grating profile due to shadow deposition of material (atoms or molecules) incident at the angle $\theta$.

The alteration of a grating profile by oblique shadow deposition is illustrated in FIG. 1. A beam 11 of material (atoms or molecules) is directed at an oblique angle $\theta$ to a surface of a body 10 containing a grating relief pattern defined by parallel stripes 12 of height d separated by parallel grooves 14. The angle $\theta$ lies in a plane essentially perpendicular to the grating stripes and is chosen to permit deposition only on the stripes, deposition on any planar groove bottom being virtually prevented by shadowing from the adjacent stripe. As deposition proceeds and the height of each stripe increases ($d_1, d_2 \ldots d_n$), the lengthening shadow cast by the buildup of material on the adjacent stripe results in the formation of a planar upright wall 16 on the side facing the incident beam. If deposition is from one side of the normal to the surface only, as shown in FIG. 1, an asymmetric profile typically develops; simultaneous or alternating depositions from both sides of the normal forms a symmetric profile.

Figure 2:
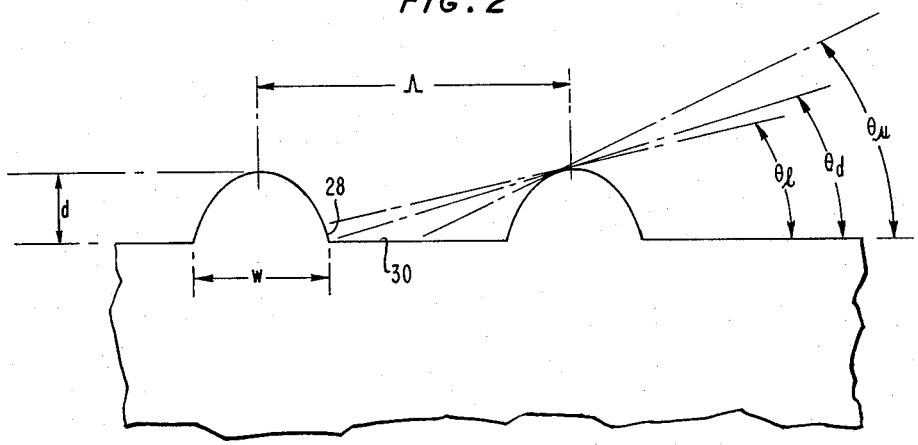
FIG. 2 is a schematic illustrating how the deposition angle $\theta$ is selected.

The selection of deposition angle $\theta$ is determined primarily by the initial grating aspect ratio $d/\Lambda$. Consider the profile shown in FIG. 2. If $\theta$ exceeds $$\theta_1 = \tan^{-1} \frac{d}{\Lambda/2},$$

material will be deposited at the center of the groove which is clearly undesirable. If $\theta$ is less than $\theta_1 = \tan^{-1} d/\Lambda$, the lateral segment 28 of the stripe adjacent the surface 30 will not receive coverage, a condition which may lead to an irregularity in groove profile if ion-beaming milling is subsequently used. For a stripe of width w at surface 30 the appropriate value for $\theta$, according to this simple picture, would be $$\theta_d = \tan^{-1} \frac{d}{\Lambda - \frac{w}{2}}.$$

Such a choice would assure complete coverage of the stripe while minimizing shrinkage of the groove width. A typical set of parameters might be $\Lambda = 6000$ Angstroms, $d = 2000$ Angstroms, $w = 3500$ Angstroms, so that $\theta_d = 25$ degrees. In practice, however, it is found that if the sticking probability of the incident material is less than unity, the choice of deposition angle should be modified to account for partial reflection of the incident atoms or molecules with subsequent deposition on the shadowed side of the adjacent stripe. If $\theta$ is too large, such deposition will be excessive. It is found that deposition at $\theta_d$ leads to such deposits, but deposition at $\theta_1$ does not. In fact, deposition at $\theta_1$ seems to result in a balanced deposition of material on each side of a grating stripe even though atoms or molecules are incident from one side only. For the parameters cited previously, deposition at $\theta_1$ means reducing the incident angle from 25 to 18 degrees. Although the penalty for incidence at $\theta_1$ is incomplete coverage of the stripe, it is found that some coverage is obtained, either as a result of a second reflection from the shadowed wall of the adjacent stripe, or as a result of imperfect collimation of the incident beam. Thus, deposition at $\theta_1 \lesssim \theta \lesssim \theta_d$ is preferred.

EXAMPLES

The usefulness of these techniques has been demonstrated in several ways: (1) to transform a nearly sinusoidal relief pattern in photoresist to a pattern with deep grooves and planar vertical walls. The symmetric pattern was produced by a series of alternating depositions, simulating simultaneous deposition from both sides. Masks with vertical walls and a groove aspect ratio (depth/period) of unity (limited only by the deposition time) have been generated; (2) to generate relatively deep corrugations on an yttrium aluminum garnet (YAG) surface; (3) to increase the groove depth of an existing grating on GaAs.

The generation of deep grooves in a YAG substrate is a particularly difficult problem. Since the refractive index of YAG is near that of typical photoresists such as AZ-1350, it is possible to pattern deep grooves in photoresist for subsequent ion-beam milling. But because the ion-beam milling rate of YAG (60 Angstroms/min.) is much lower than AZ-1350 photoresist (170 Angstroms/min.), I have been unable to achieve groove depths in YAG greater than 400 Angstroms by ion-beam milling through such a photoresist mask. Unfortunately, other dry processing methods such as plasma etching and reactive rf-sputter etching, techniques that have been used to produce deep grooves with vertical walls in $SiO_2$ films, cannot be applied to YAG. These methods are based on the formation of a volatile compound by reaction of an active species in the plasma with atoms of the underlying body, but there are no known volatile compounds associated with the components of YAG. And wet chemical etching with phosphoric acid requires temperatures greater than 400 degrees C. for a polished surface.

The invention has been useful in defining deep grooves in YAG by means of oblique shadow deposition of metals onto relief patterns in photoresist. Ta and Ti were selected to take advantage of their low ion-beam milling rates (60 and 50 Angstroms/min., respectively) compared with AZ-1350 photoresist. An asymmetric mask profile, as in FIG. 1, resulted from Ta deposition from one side only at an angle of 20 degrees. There were notable planar walls and the absence of Ta deposit in the openings to the YAG body. Ion-beam milling parallel to the grooves produced a slightly asymmetric triangular profile 2660 Angstroms deep in the YAG.

Figure 3:
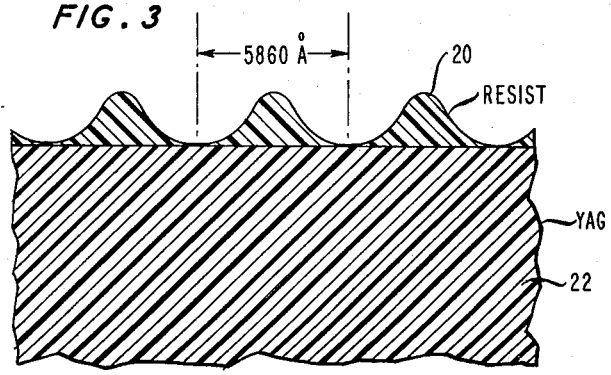
FIGS. 3-5 show the sequential steps of fabricating a grating in YAG by means of alternate depositions of Ta at an angle of 20 degrees in accordance with this invention. More specifically.
Figure 4:
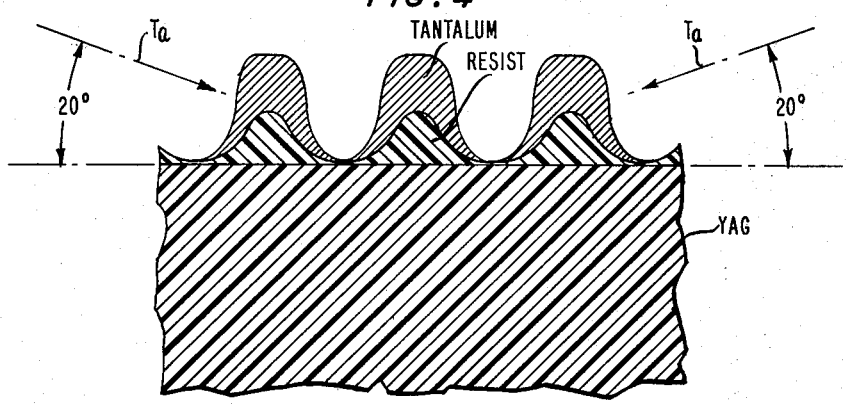
Figure 5:
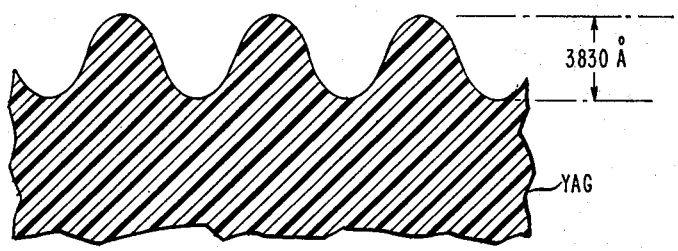

Symmetric mask patterns were also produced by a series of alternating Ta depositions at 20 degrees as shown in FIGS. 3, 4 and 5. A sinusoidal resist pattern 20 was formed by holographic exposure and development on a YAG body 22. The peak resist height was 2170 Angstroms and the periodicity of the pattern was 5860 Angstroms as shown in FIG. 3. After 4 alternating Ta depositions, each 30 min. long, the mask profile was altered so that the composite mask had nearly planar vertical walls and a height of 3830 Angstroms. The aspect ratio had been increased from 0.37 to 0.65. Triangular grooves nearly 4000 Angstroms deep were Argon ion-milled into the YAG body. It should be mentioned that the transformation to vertical and near vertical walls makes possible the use of lift-off techniques in subsequent processing. From this illustration, one may conclude that high efficiency gratings may be produced on other hard materials such as $Al_2O_3$, YIG, SiC and diamond.

The alteration of the groove profile of an existing grating on a (100) GaAs body was also demonstrated. Initially, a shallow grating 500 Angstroms deep was generated in the substrate by conventional means. After alternating depositions of Ti at 8 degrees (the shadowing being provided by the existing grating) followed by Argon ion-beam milling, the groove depth was increased to 1300 Angstroms. It is apparent that the process may be repeated to further increase the groove depth or alter the profile symmetry. The technique should also provide a means of reinforcing the narrow and structurally weak photoresist patterns associated with first-order gratings on GaAs distributed Bragg reflectors also known as distributed feedback gratings.

It is to be understood that the above-described arrangements are merely illustrative of the many possible specific embodiments which can be devised to represent application of the principles of this invention. Numerous and varied other arrangements can be devised in accordance with these principles by those skilled in the art without departing from the spirit and scope of the invention.

In particular, the characteristic of multilayer deposition with precise layer registration, together with the inherent capacity for producing structures with planar walls, suggests other applications. One possibility is to combine this technique with molecular beam epitaxy to grow multilayer semiconductor crystalline films. Indeed, the alteration of the grating profile could then be achieved by semiconductor deposition instead of metal deposition. It would then be possible to produce various microstructure arrays, such as stripe geometry heterostructure lasers, optical waveguides, and waveguide directional couplers, having dimensions smaller than can be defined by conventional photolithographic techniques.

I claim:

1. A method for forming a grating on the surface of a body (10) having a pre-existing periodic relief pattern of parallel stripes (12) separated by parallel grooves (14), said relief pattern having an aspect ratio defined by the height of the stripe divided by the period of the pattern, CHARACTERIZED BY:

increasing the aspect ratio of said periodic relief pattern by directing a beam (11) of material at a shallow angle ($\theta$) to said surface so that said stripes shadow said grooves from said beam and said material is deposited predominantly on said stripes without also depositing any significant amount of said material in said grooves, and removing a portion of said body under said grooves in order to form said grating.

2. The method of claim 1 wherein said stripes have height d, width w, and periodicity $\Lambda$ and wherein said material is deposited at an angle $\theta$ such that $\theta_1 \lesssim \theta \lesssim \theta_d$ where $$\theta_d = \tan^{-1} \frac{d}{\Lambda - w/2}$$

-continued
$$\theta_1 = \tan^{-1}\frac{d}{\Lambda}.$$

3. The method of claims 1 or 2 wherein said pattern is formed in a masking layer deposited on the surface of said body.

4. The method of claim 3 wherein said masking layer comprises a photoresist and said material comprises a metal.

5. The method of claim 4 wherein said metal is selected from the group consisting of Ta and Ti.

6. The method of claim 4 wherein said body has a lower ion-milling rate than said photoresist and including the additional step of removing a portion of said body under said grooves, thereby to form a grating in said body.

7. The method of claim 6 wherein said body comprises YAG.

8. The method of claims 1 or 3 wherein said pattern is formed in a surface layer of said body.

9. The method of claims 1 or 3 wherein said beam is directed in a plane essentially perpendicular to said stripes and from one direction only.

10. The method of claims 1 or 3 wherein said beam is directed in a plane essentially perpendicular to said stripes and alternately at angles on opposite sides of the normal to said surface.

* * * * *